(12) United States Patent
Jia

(10) Patent No.: US 9,680,482 B2
(45) Date of Patent: Jun. 13, 2017

(54) PHASE-LOCKED LOOP DEVICE

(71) Applicants: Semiconductor Manufacturing International (Shanghai) Corporation, Shanghai (CN); Semiconductor Manufacturing International (Beijing) Corporation, Beijing (CN)

(72) Inventor: Hai Long Jia, Shanghai (CN)

(73) Assignee: Semiconductor Manufacturing International (Shanghai) Corporation (CN)

( * ) Notice: Subject to any disclaimer, the term of this patent is extended or adjusted under 35 U.S.C. 154(b) by 0 days.

(21) Appl. No.: 15/066,973

(22) Filed: Mar. 10, 2016

(65) Prior Publication Data

US 2017/0093408 A1 Mar. 30, 2017

(30) Foreign Application Priority Data

Sep. 25, 2015 (CN) .......................... 2015 1 0618118

(51) Int. Cl.
*H03L 7/06* (2006.01)
*H03L 7/089* (2006.01)
(Continued)

(52) U.S. Cl.
CPC ............ *H03L 7/0891* (2013.01); *H03L 7/093* (2013.01); *H03L 7/099* (2013.01)

(58) Field of Classification Search
USPC .................................. 327/147–149, 156–158
See application file for complete search history.

(56) References Cited

U.S. PATENT DOCUMENTS

| 6,163,184 A | 12/2000 | Larsson |
| 8,415,998 B2 * | 4/2013 | Tabata .................... H03L 7/089 327/147 |

(Continued)

FOREIGN PATENT DOCUMENTS

EP         1292032 A2    3/2003

OTHER PUBLICATIONS

Jia, et al., "A self-biased PLL with low power and compact area", Design Service Center, Semiconductor Manufacturing International (Shanghai) Corp., 18 Zhanghiang Road, Shanghai, P.R.C. 201203, Apr. 30, 2015, 8 pages.

(Continued)

*Primary Examiner* — Adam Houston
(74) *Attorney, Agent, or Firm* — Innovation Counsel LLP

(57) ABSTRACT

A phase-locked loop device may include the following elements: a phase frequency detector configured to generate a control signal; a charge pump connected to the phase frequency detector; a loop filter connected to the charge pump and configured to generate a control voltage based on a first current received from the charge pump, wherein the charge pump is configured to generate a second current based on the control signal and a first copy of the control voltage and to provide the second current to the loop filter, the second current being linearly related to the control voltage; a voltage-controlled oscillator connected to the loop filter and configured to generate an output signal based on a second copy of the control voltage, wherein a frequency of the output signal is directly proportional to the control voltage; and a signal processor connected between the voltage-controlled oscillator and the phase frequency detector.

19 Claims, 5 Drawing Sheets

(51) Int. Cl.
*H03L 7/099* (2006.01)
*H03L 7/093* (2006.01)

(56) References Cited

U.S. PATENT DOCUMENTS

| | | |
|---|---|---|
| 2008/0136472 A1 | 6/2008 | Shor |
| 2008/0157878 A1 | 7/2008 | Ardehali |
| 2008/0186066 A1 | 8/2008 | Jung et al. |
| 2008/0231346 A1 | 9/2008 | Hung |
| 2009/0273379 A1 | 11/2009 | Fu |
| 2010/0085092 A1* | 4/2010 | Shin ............... H03L 7/087 327/157 |
| 2011/0063004 A1* | 3/2011 | Chen ............... H03L 7/093 327/157 |
| 2013/0194012 A1* | 8/2013 | Hsu ............... H03L 7/0896 327/157 |
| 2015/0116017 A1 | 4/2015 | Fu |
| 2015/0200589 A1* | 7/2015 | Lee ............... H02M 3/07 327/157 |
| 2015/0318859 A1* | 11/2015 | Fang ............... H03L 7/0891 327/157 |

OTHER PUBLICATIONS

John G. Manteatis, "Low-Jitter Process-Independent DLL and PLL Based on Self-Biased Techniques", IEEE Journal of Sold-State Circuits, vol. 31, No. 11, Nov. 1996, pp. 1723-1732.
European Search Report corresponding to EP 16190396, Jan. 24, 2017, 2 pages.

* cited by examiner

PHASE-LOCKED LOOP DEVICE

CROSS-REFERENCE TO RELATED APPLICATION

This application claims priority to and benefit of Chinese Patent Application No. 201510618118.5, filed on 25 Sep. 2015; the Chinese Patent Application is incorporated herein by reference in its entirety.

BACKGROUND OF THE INVENTION

The technical field is related to a phase-locked loop device.

A phase-locked loop is a device for which the phase of the output signal is related to the phase of the input signal. A phase-locked loop may function as a clock generation module in, for example, a microprocessor, an interface chip, or a communication chip.

SUMMARY

An embodiment may be related to a phase-locked loop device. The phase-locked loop device may include a phase frequency detector, a charge pump, a loop filter, a voltage-controlled oscillator, and a signal processor. The phase frequency detector may receive an input signal and a first feedback signal and may generate a control signal set based on the input signal and the first feedback signal. The charge pump may be electrically connected to the phase frequency detector. The loop filter may be electrically connected to the charge pump, may receive a first current from the charge pump, and may generate a control voltage based on the first current. The charge pump may generate a second current based on the control signal set and a first copy of the control voltage and may provide the second current to the loop filter. The second current may be linearly related to the control voltage. The voltage-controlled oscillator may be electrically connected to the loop filter and may generate an output signal based on a second copy of the control voltage. A frequency of the output signal may be directly proportional to the control voltage. The signal processor may be electrically connected to each of the voltage-controlled oscillator and the phase frequency detector, may generate a second feedback signal based on the output signal, and may provide the second feedback signal to the phase frequency detector. The signal processor may be a frequency divider.

The charge pump may include a first p-channel transistor, a second p-channel transistor, a first n-channel transistor, a second n-channel transistor, a third n-channel transistor, a current mirror, a p-channel mirror biasing circuit set, and an n-channel mirror biasing circuit set. One or more of the p-channel transistors may be one or more p-channel metal-oxide-semiconductor (PMOS) transistors. One or more of the n-channel transistors may be one or more n-channel metal-oxide-semiconductor (NMOS) transistors. The p-channel mirror biasing circuit set may include one or more p-channel metal-oxide-semiconductor (PMOS) mirror biasing circuits. The n-channel mirror biasing circuit set may include one or more n-channel metal-oxide-semiconductor (NMOS) mirror biasing circuits.

The first p-channel transistor may be electrically connected to an output terminal of the loop filter, may receive a first duplicate of the first copy of the control voltage, and may receive a first copy of a first positive supply voltage. The second p-channel transistor may be electrically connected to the output terminal of the loop filter, may receive a second duplicate of the first copy of the control voltage, and may receive a second copy of the first positive supply voltage. The first n-channel transistor may be electrically connected to the first p-channel transistor and may receive a first copy of a ground voltage. The second n-channel transistor may be electrically connected to the second p-channel transistor. The third n-channel transistor may be electrically connected to each of the second n-channel transistor and the second p-channel transistor and may receive a second copy of the ground voltage. The current mirror may be electrically connected to an input terminal of the loop filter, may provide the second current to the loop filter, may receive a third copy of the first positive supply voltage, and may receive a third copy of the ground voltage. The p-channel mirror biasing circuit set may be electrically connected to the current mirror. The n-channel mirror biasing circuit set may be electrically connected to each of the current mirror and the second n-channel transistor.

A gate terminal of the first p-channel transistor may receive the first duplicate of the first copy of the control voltage. A source terminal of the first p-channel transistor may receive the first copy of the first positive supply voltage. A drain terminal of the first p-channel transistor may be electrically connected to each of a drain terminal of the first n-channel transistor and a gate terminal of the first n-channel transistor.

A gate terminal of the second p-channel transistor may receive the second duplicate of the first copy of the control voltage. A source terminal of the second p-channel transistor may receive the second copy of the first positive supply voltage. A drain terminal of the second p-channel transistor may be electrically connected to each of a drain terminal of the second n-channel transistor and a gate terminal of the third n-channel transistor.

A gate terminal of the second n-channel transistor may be electrically connected to the n-channel mirror biasing circuit set.

The first p-channel transistor may operate in a first linear region (i.e., in a first ohmic mode). The second p-channel transistor may operate in a second linear region (i.e., in a second ohmic mode).

The current mirror may include a third p-channel transistor, a fourth p-channel transistor, a fifth p-channel transistor, a sixth p-channel transistor, a fourth n-channel transistor, a fifth n-channel transistor, a sixth n-channel transistor, a seventh n-channel transistor, an first amplifier, and an output terminal of the current mirror. One or more of the p-channel transistors may be one or more p-channel metal-oxide-semiconductor (PMOS) transistors. One or more of the n-channel transistors may be one or more n-channel metal-oxide-semiconductor (NMOS) transistors.

The third p-channel transistor may receive the third copy of the first positive supply voltage and may be electrically connected to a first output terminal of the p-channel mirror biasing circuit set. The fourth p-channel transistor may be electrically connected to the third p-channel transistor and may be electrically connected to a second output terminal of the p-channel mirror biasing circuit set. The fifth p-channel transistor may be electrically connected to the fourth p-channel transistor. The sixth p-channel transistor may be electrically connected to each of the fourth p-channel transistor and the fifth p-channel transistor. The fourth n-channel transistor may receive the third copy of the ground voltage and may be electrically connected to a first output terminal of the n-channel mirror biasing circuit set. The fifth n-channel transistor may be electrically connected to the fourth n-channel transistor and may be electrically connected to a second output terminal of the n-channel mirror biasing circuit set. The sixth n-channel transistor may be electrically connected to the fifth n-channel transistor. The seventh n-channel transistor may be electrically connected to each of the fifth n-channel transistor and the sixth n-channel transistor. The first amplifier may be electrically connected to each of the fifth p-channel transistor, the sixth p-channel transistor, the sixth n-channel transistor, and the seventh n-channel transistor. The output terminal of the current mirror may be electrically connected to each of the sixth p-channel transistor, the seventh n-channel transistor, the first amplifier, and the input terminal of the loop filter and may output the second current.

A source terminal of the third p-channel transistor may receive the third copy of the first positive supply voltage. A gate terminal of the third p-channel transistor may be electrically connected to the first output terminal of the p-channel mirror biasing circuit set. A drain terminal of the third p-channel transistor may be electrically connected to a source terminal of the fourth p-channel transistor.

A gate terminal of the fourth p-channel transistor may be electrically connected to the second output terminal of the p-channel mirror biasing circuit set. A drain terminal of the fourth p-channel transistor may be electrically connected each of a source terminal of the fifth p-channel transistor and a source terminal of the sixth p-channel transistor.

A gate terminal of the fifth p-channel transistor may receive a first differential component of the control signal set. A drain terminal of the fifth p-channel transistor may be electrically connected to each of a drain terminal of the sixth n-channel transistor, an output terminal of the first amplifier, and an inverting input terminal of the first amplifier.

A gate terminal of the sixth p-channel transistor may receive a second differential component of the control signal set. A drain terminal of the sixth p-channel transistor may be electrically connected to each of a drain terminal of the seventh n-channel transistor, a non-inverting input terminal of the first amplifier, and the output terminal of the current mirror.

A source terminal of the fourth n-channel transistor may receive the third copy of the ground voltage. A gate terminal of the fourth n-channel transistor may be electrically connected to the first output terminal of the n-channel mirror biasing circuit set. A drain terminal of the fourth n-channel transistor may be electrically connected to a source terminal of the fifth n-channel transistor.

A gate terminal of the fifth n-channel transistor may be electrically connected to the second output terminal of the n-channel mirror biasing circuit set. A drain terminal of the fifth n-channel transistor may be electrically connected to each of a source terminal of the sixth n-channel transistor and a source terminal of the seventh n-channel transistor.

A gate terminal of the sixth n-channel transistor may receive a third differential component of the control signal set. A drain terminal of the sixth n-channel transistor may be electrically connected to each of the drain terminal of the fifth p-channel transistor, the output terminal of the first amplifier, and the inverting input terminal of the first amplifier.

A gate terminal of the seventh n-channel transistor may receive a fourth differential component of the control signal set. A drain terminal of the seventh n-channel transistor may be electrically connected to each of a drain terminal of the sixth p-channel transistor, the non-inverting input terminal of the first amplifier, and the output terminal of the current mirror.

The voltage-controlled oscillator may include a voltage-controlled frequency unit, an oscillation unit, and an output unit. The voltage-controlled frequency unit may receive a first copy of a positive supply voltage, may be electrically connected to the loop filter, and may generate a first intermediate signal based on the second copy of the control voltage. A frequency of the first intermediate signal may be directly proportional to the control voltage. The oscillation unit may be electrically connected to the voltage-controlled frequency unit and may generate a second intermediate signal based on the first intermediate signal. The output unit may be electrically connected to the oscillation unit and may generate the output signal based on the second intermediate signal.

The voltage-controlled frequency unit may include a seventh p-channel transistor, an eighth p-channel transistor, and a second amplifier. The seventh p-channel transistor may be electrically connected to the loop filter, may receive a first duplicate of the second copy of the control voltage, and may receive the first copy of the positive supply voltage. The eighth p-channel transistor may be electrically connected to each of the seventh p-channel transistor and an input terminal of the oscillation unit. The second amplifier may be electrically connected to each of the loop filter, the seventh p-channel transistor, and the eighth p-channel transistor and may receive a second duplicate of the second copy of the control voltage.

A gate terminal of the seventh p-channel transistor may receive the first duplicate of the second copy of the control voltage. A source terminal of the seventh p-channel transistor may receive the positive supply voltage. A drain terminal of the seventh p-channel transistor may be electrically connected to a source terminal of the eighth p-channel transistor.

A gate terminal of the eighth p-channel transistor may be electrically connected to each of an output terminal of the second amplifier and an inverting input terminal of the second amplifier. A drain terminal of the eighth p-channel transistor may be electrically connected to the input terminal of the oscillation unit.

A non-inverting input terminal of the second amplifier may be electrically connected to each of the loop filter and the seventh p-channel transistor and may receive the second duplicate of the second copy of the control voltage.

The seventh p-channel transistor operates in a third linear region (i.e., in a third ohmic mode). The eighth p-channel transistor operates in a saturation region (i.e., in an active mode).

The phase-locked loop device may include a voltage unit (or startup voltage unit). The voltage unit may include a first switch, a first resistor, a second resistor, a second switch, and a third switch. A first terminal of the first switch may receive a second copy of the positive supply voltage. A first terminal of the first resistor may be electrically connected to a second terminal of the first switch. A first terminal of the second resistor may be electrically connected to a second terminal of the first resistor. A first terminal of the second switch may be electrically connected to a second terminal of the second resistor. A second terminal of the second switch may receive a ground voltage. A first terminal of the third switch may be electrically connected to each of the second terminal of the first resistor and the first terminal of the second resistor. A second terminal of the third switch may be electrically connected to each of an input terminal of the voltage-controlled frequency unit (i.e., an input terminal of the voltage-controlled oscillator) and an input terminal of the charge pump and may output a startup voltage. The second terminal of the third switch may be electrically connected to each of the gate terminal of the seventh p-channel transistor, the non-inverting input terminal of the second amplifier, and the input terminal of the charge pump.

The input terminal of the charge pump may receive a first copy of the startup voltage. The input terminal of the input terminal of the voltage-controlled frequency unit (i.e., the input terminal of the voltage-controlled oscillator) may receive a second copy of the startup voltage. The gate terminal of the first p-channel transistor of the charge pump may receive a first duplicate of the first copy of the startup voltage. The gate terminal of the second p-channel transistor of the charge pump may receive a second duplicate of the first copy of the startup voltage.

An electrical resistance of the first resistor may be equal to an electrical resistance of the second resistor.

The oscillation unit may include a first inverter, a second inverter, and a third inverter. A total number of inverters in the oscillation unit may be an odd number.

A positive voltage supply terminal of the first inverter may be electrically connected to the voltage-controlled frequency unit and may receive a first copy of the first intermediate signal.

An input terminal of the second inverter may be electrically connected to an output terminal of the first inverter. A positive voltage supply terminal of the second inverter may be electrically connected to the voltage-controlled frequency unit and may receive a second copy of the first intermediate signal.

An output terminal of the third inverter may be electrically connected to each of an input terminal of the first inverter and an input terminal of the output unit of the voltage-controlled oscillator. A positive voltage supply terminal of the third inverter may be electrically connected to the voltage-controlled frequency unit and may receive a third copy of the first intermediate signal.

The output unit of the voltage-controlled oscillator may include a fourth inverter. An input terminal of the fourth inverter may be electrically connected to an output terminal of the oscillation unit (e.g., the output terminal of the third inverter) and may receive the second intermediate signal. An output terminal of the fourth inverter may output the output signal.

According to embodiments, the phase-locked loop device may have a substantially small size, may operate with satisfactory stability, and/or may operate with substantially low power consumption. Advantageously, the phase-locked loop device may be suitable for various applications.

The above summary is related to some of many embodiments of the invention disclosed herein and is not intended to limit the scope of the invention.

DETAILED DESCRIPTION

Figure 1:
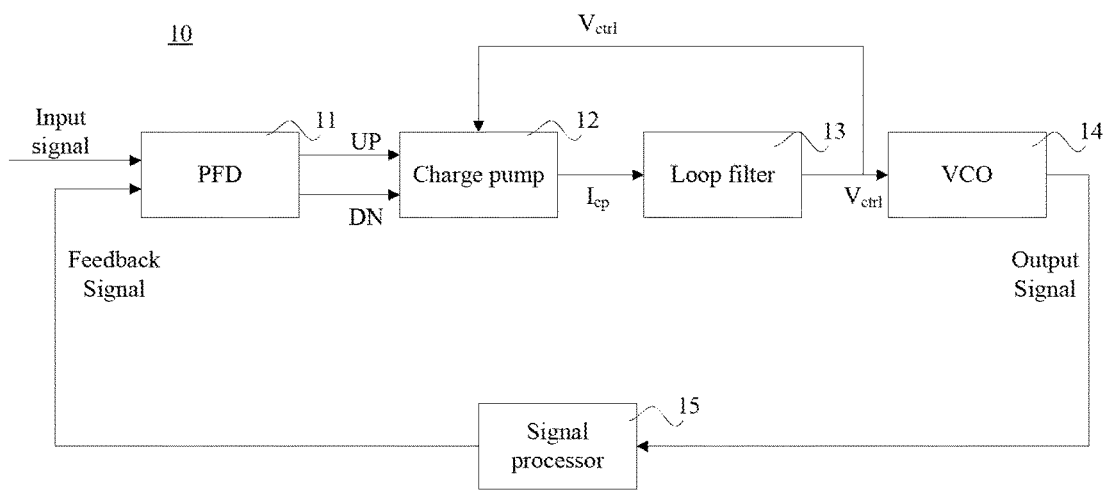
FIG. 1 shows a schematic diagram (e.g., a schematic block diagram) that illustrates elements and/or structures in a phase-locked loop device in accordance with one or more embodiments.

Example embodiments are described with reference to the accompanying drawings. As those skilled in the art would realize, the described embodiments may be modified in various different ways, all without departing from the spirit or scope. Embodiments may be practiced without some or all of these specific details. Well known process steps and/or structures may not have been described in detail in order to not unnecessarily obscure described embodiments.

The drawings and description are illustrative and not restrictive. Like reference numerals may designate like (e.g., analogous or identical) elements in the specification. Repetition of description may be avoided.

The relative sizes and thicknesses of elements shown in the drawings are for facilitate description and understanding, without limiting possible embodiments. In the drawings, the thicknesses of some layers, films, panels, regions, etc., may be exaggerated for clarity.

Illustrations of example embodiments in the figures may represent idealized illustrations. Variations from the shapes illustrated in the illustrations, as a result of, for example, manufacturing techniques and/or tolerances, may be possible. Thus, the example embodiments should not be construed as limited to the shapes or regions illustrated herein but are to include deviations in the shapes. For example, an etched region illustrated as a rectangle may have rounded or curved features. The shapes and regions illustrated in the figures are illustrative and should not limit the scope of the example embodiments.

Although the terms "first", "second", etc. may be used herein to describe various elements, these elements should not be limited by these terms. These terms may be used to distinguish one element from another element. Thus, a first element recited in this application may be termed a second element without departing from embodiments. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

If a first element (such as a layer, film, region, or substrate) is referred to as being "on", "neighboring", "connected to", or "coupled with" a second element, then the first element can be directly on, directly neighboring, directly connected to, or directly coupled with the second element, or an intervening element may also be present between the first element and the second element. If a first element is referred to as being "directly on", "directly neighboring", "directly connected to", or "directed coupled with" a second element, then no intended intervening element (except environmental elements such as air) may be provided between the first element and the second element.

Spatially relative terms, such as "beneath", "below", "lower", "above", "upper", and the like, may be used herein for ease of description to describe one element or feature's spatial relationship to another element(s) or feature(s) as illustrated in the figures. It will be understood that the spatially relative terms may encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein should be interpreted accordingly.

The terminology used herein is for the purpose of describing particular embodiments and is not intended to limit the embodiments. As used herein, the singular forms, "a", "an", and "the" may indicate plural forms as well, unless the context clearly indicates otherwise. The terms "includes" and/or "including", when used in this specification, may specify the presence of stated features, integers, steps, operations, elements, and/or components, but may not preclude the presence or addition of one or more other features, integers, steps, operations, elements, components, and/or groups.

Unless otherwise defined, terms (including technical and scientific terms) used herein have the same meanings as commonly understood by one of ordinary skill in the art. Terms, such as those defined in commonly used dictionaries, should be interpreted as having meanings that are consistent with their meanings in the context of the relevant art and should not be interpreted in an idealized or overly formal sense unless expressly so defined herein.

The term "connect" may mean "electrically connect". The term "insulate" may mean "electrically insulate". The term "conductive" may mean "electrically conductive". The term "electrically connected" may mean "electrically connected without any intervening transistors" or "electrically connected through no intervening transistors".

Unless explicitly described to the contrary, the word "comprise" and variations such as "comprises", "comprising", "include", or "including" may imply the inclusion of stated elements but not the exclusion of other elements.

One or more the electrical connections described in this application may be connected through no intervening transistor.

Various embodiments, including methods and techniques, are described in this disclosure. Embodiments may also cover an article of manufacture that includes a non-transitory computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, embodiments may also cover apparatuses for practicing embodiments. Such apparatus may include circuits, dedicated and/or programmable, to carry out operations pertaining to embodiments. Examples of such apparatus include a general purpose computer and/or a dedicated computing device when appropriately programmed and may include a combination of a computer/computing device and dedicated/programmable hardware circuits (such as electrical, mechanical, and/or optical circuits) adapted for the various operations pertaining to embodiments.

FIG. 1 shows a schematic diagram (e.g., a schematic block diagram) that illustrates elements and/or structures in a phase-locked loop device 10 in accordance with one or more embodiments. The phase-locked loop device 10 may include a phase frequency detector 11 (or PFD 11), a charge pump 12, a loop filter 13, a voltage-controlled oscillator 14 (or VCO 14), and a signal processor 15.

The phase frequency detector 11 may receive an input signal and a feedback signal, e.g., a first feedback signal, and may generate a control signal set based on the input signal and the first feedback signal. The control signal set may include a pulse control signal UP and a pulse control signal DN.

The charge pump 12 may be electrically connected to the phase frequency detector 11. The loop filter 13 may be electrically connected to the charge pump 12. The loop filter 13 may receive a charging or discharging current Icp, e.g., a first current, from the charge pump 12 and may generate a control voltage Vctrl based on the first current. The charge pump 12 may generate a charging or discharging current Icp, e.g., a second current, based on the control signal set and a first copy of the control voltage Vctrl and may provide the second current to the loop filter 13. The second current (i.e., a charging or discharging current Icp) may be set by the charge pump 12 be linearly related to the control voltage Vctrl. The control voltage may be in a range of 0.4 V to 0.9V, e.g., 0.7 V.

The voltage-controlled oscillator 14 may be electrically connected to the loop filter 13 and may generate an output signal based on a second copy of the control voltage Vctrl. A frequency (fvco) of the output signal may set by the voltage-controlled oscillator 14 to be directly proportional to the control voltage Vctrl.

The signal processor 15 may be electrically connected to each of the voltage-controlled oscillator 14 and the phase frequency detector 11. The signal processor 15 may generate a feedback signal, e.g., a second feedback signal, based on the output signal and may provide the second feedback signal to the phase frequency detector 11. The signal processor 15 may be a frequency divider, e.g., a successive frequency divider.

According to embodiments, the frequency fvco of the output signal provided by the voltage-controlled oscillator 14 may be directly proportional to the control voltage Vctrl; therefore, the gain (Kvco) of the voltage-controlled oscillator 14 may be substantially constant. Since the charging or discharging current Icp may be linearly related to the control voltage Vctrl, the current Icp may be directly proportional to the frequency fvco. The division ratio (N) of the signal processor 15 (e.g., a frequency divider) may be directly proportional to the frequency fvco; therefore, the Icp-to-N ratio may be substantially constant. Given that the gain Kvco and the Icp-to-N ratio both may be substantially constant, the open loop gain, closed loop damping factor, and/or attenuation frequency associated with the phase-locked loop device 10 may be substantially stable. Advantageously, the phase-locked loop device 10 may operate with satisfactory stability.

Figure 2:
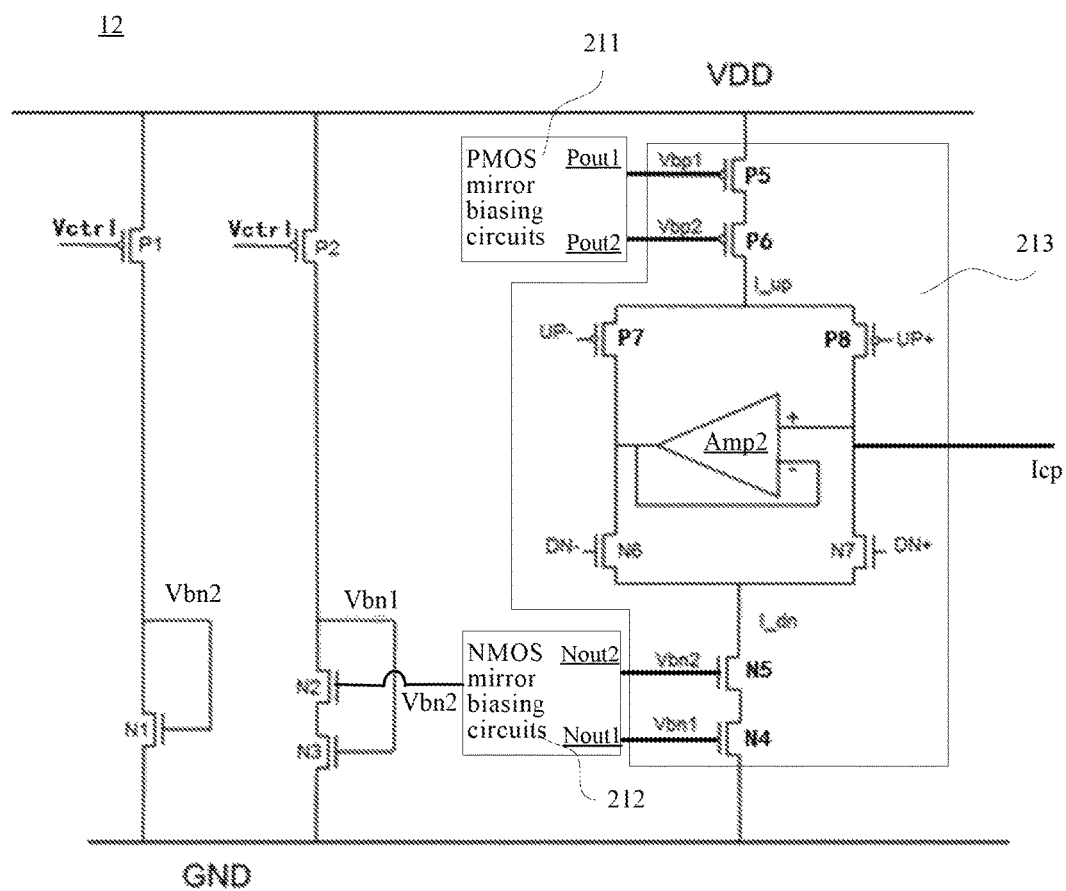
FIG. 2 shows a schematic diagram (e.g., a schematic circuit diagram) that illustrates elements and/or structures in a charge pump of a phase-locked loop device in accordance with one or more embodiments.

FIG. 2 shows a schematic diagram (e.g., a schematic circuit diagram) that illustrates elements and/or structures in the charge pump 12 in accordance with one or more embodiments. The charge pump 12 may include a p-channel transistor P1, a p-channel transistor P2, an n-channel transistor N1, an n-channel transistor N2, an n-channel transistor N3, a current mirror 213, a p-channel mirror biasing circuit set 211, and an n-channel mirror biasing circuit set 212. One or more of the p-channel transistors may be one or more p-channel metal-oxide-semiconductor (PMOS) transistors. One or more of the n-channel transistors may be one or more n-channel metal-oxide-semiconductor (NMOS) transistors. The p-channel mirror biasing circuit set 211 may include one or more p-channel metal-oxide-semiconductor (PMOS) mirror biasing circuits. The n-channel mirror biasing circuit set 212 may include one or more n-channel metal-oxide-semiconductor (NMOS) mirror biasing circuits.

The p-channel transistor P1 may be electrically connected to an output terminal of the loop filter 13, may receive a first duplicate of the first copy of the control voltage Vctrl, and may receive a first copy of a positive supply voltage VDD. The p-channel transistor P2 may be electrically connected to the output terminal of the loop filter 13, may receive a second duplicate of the first copy of the control voltage Vctrl, and may receive a second copy of the positive supply voltage VDD. The n-channel transistor N1 may be electrically connected to the p-channel transistor P1 and may receive a first copy of a ground voltage GND. The n-channel transistor N2 may be electrically connected to the p-channel transistor P2. The n-channel transistor N3 may be electrically connected to each of the n-channel transistor N2 and the p-channel transistor P2 and may receive a second copy of the ground voltage GND. The current mirror 213 may be electrically connected to an input terminal of the loop filter 13, may provide a charging or discharging current Icp (e.g., the second current) to the loop filter 13, may receive a third copy of the positive supply voltage VDD, and may receive a third copy of the ground voltage GND. The p-channel mirror biasing circuit set 211 may be electrically connected to the current mirror 213. The n-channel mirror biasing circuit set 212 may be electrically connected to each of the current mirror 213 and the n-channel transistor N2.

A gate terminal of the p-channel transistor P1 may receive the first duplicate of the first copy of the control voltage Vctrl from the loop filter 13. A source terminal of the p-channel transistor P1 may receive the first copy of the positive supply voltage VDD. A drain terminal of the p-channel transistor P1 may be electrically connected to each of a drain terminal of the n-channel transistor N1 and a gate terminal of the n-channel transistor N1.

A gate terminal of the p-channel transistor P2 may receive the second duplicate of the first copy of the control voltage Vctrl from the loop filter 13. A source terminal of the p-channel transistor P2 may receive the second copy of the positive supply voltage VDD. A drain terminal of the p-channel transistor P2 may be electrically connected to each of a drain terminal of the n-channel transistor N2 and a gate terminal of the n-channel transistor N3.

A gate terminal of the n-channel transistor N2 may be electrically connected to the n-channel mirror biasing circuit set 212.

The current mirror 213 may include a p-channel transistor P5, a p-channel transistor P6, a p-channel transistor P7, a p-channel transistor P8, an n-channel transistor N4, an n-channel transistor N5, an n-channel transistor N6, an n-channel transistor N7, an amplifier Amp2, and an output terminal of the current mirror 213 (which may output a charging or discharging current Icp). One or more of the p-channel transistors may be one or more p-channel metal-oxide-semiconductor (PMOS) transistors. One or more of the n-channel transistors may be one or more n-channel metal-oxide-semiconductor (NMOS) transistors.

The p-channel transistor P5 may receive the third copy of the positive supply voltage VDD and may be electrically connected to a first output terminal Pout1 of the p-channel mirror biasing circuit set 211. The p-channel transistor P6 may be electrically connected to the p-channel transistor P5 and may be electrically connected to a second output terminal Pout2 of the p-channel mirror biasing circuit set 211. The p-channel transistor P7 may be electrically connected to the p-channel transistor P6. The p-channel transistor P8 may be electrically connected to each of the p-channel transistor P6 and the p-channel transistor P7. The n-channel transistor N4 may receive the third copy of the ground voltage GND and may be electrically connected to a first output terminal Nout1 of the n-channel mirror biasing circuit set 212. The n-channel transistor N5 may be electrically connected to the n-channel transistor N4 and may be electrically connected to a second output terminal Nout2 of the n-channel mirror biasing circuit set 212. The n-channel transistor N6 may be electrically connected to the n-channel transistor N5. The n-channel transistor N7 may be electrically connected to each of the n-channel transistor N5 and the n-channel transistor N6. The amplifier Amp2 may be electrically connected to each of the p-channel transistor P7, the p-channel transistor P8, the n-channel transistor N6, and the n-channel transistor N7. The output terminal of the current mirror 213 may be electrically connected to each of the p-channel transistor P8, the n-channel transistor N7, the amplifier Amp2, and the input terminal of the loop filter 13 and may output a charging or discharging current Icp (e.g., the first current or the second current).

A source terminal of the p-channel transistor P5 may receive the third copy of the positive supply voltage VDD. A gate terminal of the p-channel transistor P5 may be electrically connected to the first output terminal Pout1 of the p-channel mirror biasing circuit set 211. A drain terminal of the p-channel transistor P5 may be electrically connected to a source terminal of the p-channel transistor P6.

A gate terminal of the p-channel transistor P6 may be electrically connected to the second output terminal Pout2 of the p-channel mirror biasing circuit set 211. A drain terminal of the p-channel transistor P6 may be electrically connected each of a source terminal of the p-channel transistor P7 and a source terminal of the p-channel transistor P8.

A gate terminal of the p-channel transistor P7 may receive a first differential component UP+ of the control signal set (i.e., a differential component of the pulse control signal UP) from the phase frequency detector 11. A drain terminal of the p-channel transistor P7 may be electrically connected to each of a drain terminal of the n-channel transistor N6, an output terminal of the amplifier Amp2, and an inverting input terminal of the amplifier Amp2.

A gate terminal of the p-channel transistor P8 may receive a second differential component UP+ of the control signal set (i.e., a differential component of the pulse control signal UP) from the phase frequency detector 11. A drain terminal of the p-channel transistor P8 may be electrically connected to each of a drain terminal of the n-channel transistor N7, a non-inverting input terminal of the amplifier Amp2, and the output terminal of the current mirror 213.

A source terminal of the n-channel transistor N4 may receive the third copy of the ground voltage GND. A gate terminal of the n-channel transistor N4 may be electrically connected to the first output terminal Nout1 of the n-channel mirror biasing circuit set 212. A drain terminal of the n-channel transistor N4 may be electrically connected to a source terminal of the n-channel transistor N5.

A gate terminal of the n-channel transistor N5 may be electrically connected to the second output terminal Nout2 of the n-channel mirror biasing circuit set 212. A drain terminal of the n-channel transistor N5 may be electrically connected to each of a source terminal of the n-channel transistor N6 and a source terminal of the n-channel transistor N7.

A gate terminal of the n-channel transistor N6 may receive a third differential component DN− of the control signal set (i.e., a differential component of the pulse control signal DN) from the phase frequency detector 11. A drain terminal of the n-channel transistor N6 may be electrically connected to each of the drain terminal of the p-channel transistor P7, the output terminal of the amplifier Amp2, and the inverting input terminal of the amplifier Amp2.

A gate terminal of the n-channel transistor N7 may receive a fourth differential component DN+ of the control signal set (i.e., a differential component of the pulse control signal DN) from the phase frequency detector 11. A drain terminal of the n-channel transistor N7 may be electrically connected to each of a drain terminal of the p-channel transistor P8, the non-inverting input terminal of the amplifier Amp2, and the output terminal of the current mirror 213.

The gate terminals of the n-channel transistors N1, N2, and N5 may respectively receive copies of a voltage Vbn2. The gate terminals of the n-channel transistors N3 and N4 may respectively receive copies of a voltage Vbn1. The gate terminals of the p-channel transistors P5 and P6 may respectively receive voltages Vbp1 and Vpb2. The p-channel transistor P6 may provide a current I_up to the p-channel transistors P7 and P8. The n-channel transistor N5 may provide a current I_dn to the n-channel transistors P6 and P7.

Each of the p-channel transistor P1 and the p-channel transistor P2 may operate in a linear region (i.e., in an ohmic mode). The p-channel transistor P1 may operate in a first linear region (i.e., in a first ohmic mode). The p-channel transistor P2 may operate in a second linear region (i.e., in a second ohmic mode). Therefore, a charging or discharging current Icp provided by the charge pump 12 may be linearly related to a control voltage Vctrl received by the charge pump 12. Advantageously, the phase-locked loop device 10 may operate with satisfactory stability.

Dimensions of each of the p-channel transistor P1 and the p-channel transistor P2 may be configured such that each of the transistors P1 and P2 may operate in a linear region. Dimensions of the p-channel transistor P1 may be identical to dimensions of the p-channel transistor P2. A length-to-width ratio of each of the transistors P1 and P2 may be 2. A length of each of the transistors P1 and P2 may be 6 microns. A width of each of the transistors P1 and P2 may be 3 microns.

Figure 3:
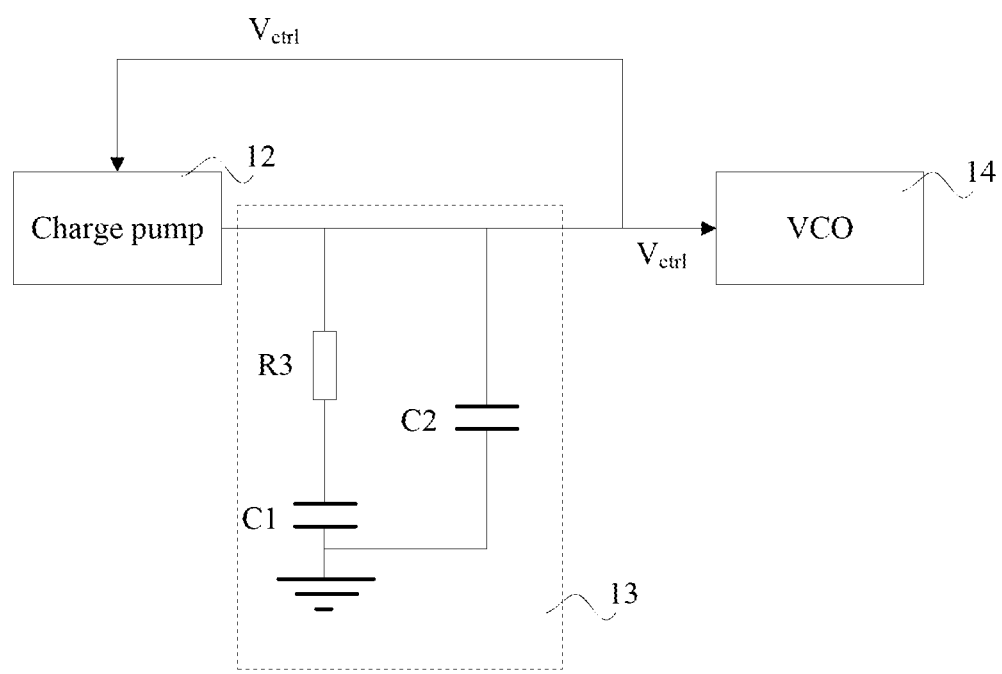
FIG. 3 shows a schematic diagram (e.g., a schematic circuit block diagram) that illustrates elements and/or structures in a loop filter of a phase-locked loop device in accordance with one or more embodiments.

FIG. 3 shows a schematic diagram (e.g., a schematic circuit block diagram) that illustrates elements and/or structures in the loop filter 13 in accordance with one or more embodiments. The loop filter 13 may include a capacitor C1, a capacitor C2, and a resistor R3. A first terminal of the resistor R3 may be electrically connected to the output terminal of the charge pump 12 and the output terminal of the loop filter 13. A second terminal of the resistor R3 may be electrically connected to a first terminal of the capacitor C1. A second terminal of the capacitor C1 may be electrically grounded. A first terminal of the capacitor C2 may be electrically connected to each of the first terminal of the resistor R3 and the output terminal of the loop filter 13. A second terminal of the capacitor C2 may be electrically connected to the second terminal of the capacitor C1 and may be electrically grounded. The output terminal of the loop filter 13 may provide a control voltage Vctrl to the charge pump 12 and the voltage-controlled oscillator 14. The loop filter 13 may function as a low-pass filter.

Figure 4:
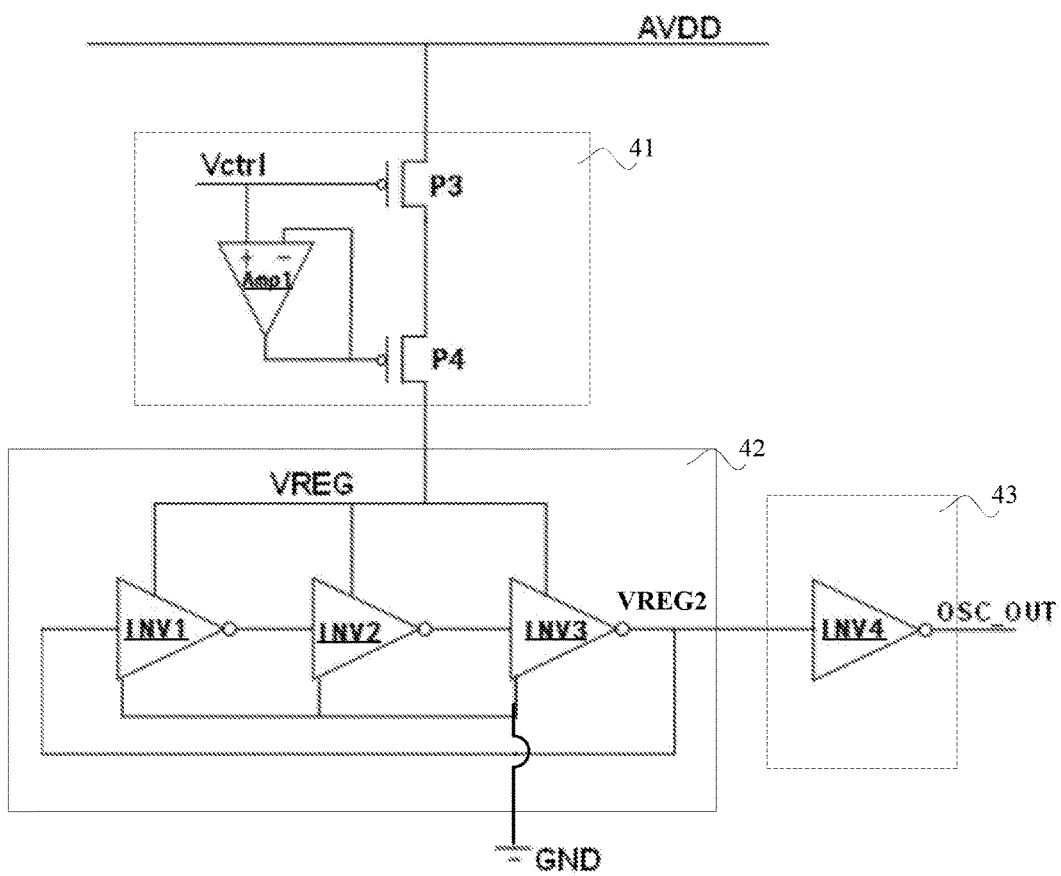
FIG. 4 shows a schematic diagram (e.g., a schematic circuit diagram) that illustrates elements and/or structures in a voltage-controlled oscillator of a phase-locked loop device in accordance with one or more embodiments.

FIG. 4 shows a schematic diagram (e.g., a schematic circuit diagram) that illustrates elements and/or structures in the voltage-controlled oscillator 14 in accordance with one or more embodiments. The voltage-controlled oscillator 14 may include a voltage-controlled frequency unit 41, an oscillation unit 42, and an output unit 43. The voltage-controlled frequency unit 41 may receive a first copy of a positive supply voltage AVDD, may be electrically connected to the loop filter 13 for receiving a second copy of a control signal Vctrl, and may generate a first intermediate signal VREG based on the second copy of the control voltage Vctrl. A frequency of the first intermediate signal VREG may be directly proportional to the control voltage Vctrl. The oscillation unit 42 may be electrically connected to the voltage-controlled frequency unit 41 and may generate a second intermediate signal VREG2 based on the first intermediate signal VREG. The output unit 43 may be electrically connected to the oscillation unit 42 and may generate an output signal (OSC_OUT) based on the second intermediate signal VREG2. The positive supply voltage AVDD may be equal to the positive supply voltage VDD.

The voltage-controlled frequency unit 41 may include a p-channel transistor P3, a p-channel transistor P4, and an amplifier Amp1. The p-channel transistor P3 may be electrically connected to the loop filter 13, may receive a first duplicate of the second copy of the control voltage Vctrl, and may receive the first copy of the positive supply voltage AVDD. The p-channel transistor P4 may be electrically connected to each of the p-channel transistor P3 and an input terminal of the oscillation unit 42. The amplifier Amp1 may be electrically connected to each of the loop filter 13, the p-channel transistor P3, and the p-channel transistor P4 and may receive a second duplicate of the second copy of the control voltage Vctrl.

A gate terminal of the p-channel transistor P3 may receive the first duplicate of the second copy of the control voltage Vctrl. A source terminal of the p-channel transistor P3 may receive the positive supply voltage AVDD. A drain terminal of the p-channel transistor P3 may be electrically connected to a source terminal of the p-channel transistor P4.

A gate terminal of the p-channel transistor P4 may be electrically connected to each of an output terminal of the amplifier Amp1 and an inverting input terminal of the amplifier Amp1. A drain terminal of the p-channel transistor P4 may be electrically connected to the input terminal of the oscillation unit 42.

A non-inverting input terminal of the amplifier Amp1 may be electrically connected to each of the loop filter 13 and the p-channel transistor P3 and may receive the second duplicate of the second copy of the control voltage Vctrl.

The p-channel transistor P3 operates in a linear region (i.e., in an ohmic mode). The p-channel transistor P4 operates in a saturation region (i.e., in an active mode). Therefore, the frequency fvco of an output signal OSC_OUT may be directly proportional to a control voltage Vctrl, such that a gain of the voltage-controlled oscillator 14 may be substantially constant. Advantageously, the phase-locked loop device 10 may operate with satisfactory stability.

Dimensions of each of the p-channel transistor P3 may be configured such that the transistor P3 may operate in a linear region. A length of the transistor P3 may be 80 microns. A width of the transistor P3 may be 3 microns.

Dimensions of each of the p-channel transistor P4 may be configured such that the transistor P4 may operate in a saturation region. A length of the transistor P4 may be 200 microns. A width of the transistor P4 may be 1 micron.

The amplifier Amp1 and the p-channel transistor P4 may form a negative feedback structure to provide a satisfactory power supply rejection ratio for minimizing undesirable influence of noise of the positive supply voltage AVDD on the first intermediate signal VREG. Advantageously, undesirable noise effects on the oscillation unit 32 may be minimized. Given that the negative feedback structure may effectively reject noise, the voltage-controlled oscillator 14 may not need relatively large-size noise-rejecting structures or components (e.g., capacitors). Advantageously, the voltage-controlled oscillator 14 and the phase-locked loop device 10 may have a substantially small size.

The oscillation unit 42 may include an inverter INV1, an inverter INV2, and an inverter INV3. A total number of inverters in the oscillation unit 42 may be an odd number that is greater than or equal to 3. One or more of the inverters of the oscillation unit 42 may be one or more complementary metal-oxide-semiconductor (CMOS) inverters. The CMOS inverters may maximize noise resistance, power efficiency, and/or load capability of the voltage-controlled oscillator 14.

A positive voltage supply terminal of the inverter INV1 may be electrically connected to the output terminal of the voltage-controlled frequency unit 41 (e.g., the drain terminal of the p-channel transistor P4) and may receive a first copy of the first intermediate signal VREG.

An input terminal of the inverter INV2 may be electrically connected to an output terminal of the inverter INV1. A positive voltage supply terminal of the inverter INV2 may be electrically connected to the output terminal of the voltage-controlled frequency unit 41 (e.g., the drain terminal of the p-channel transistor P4) and may receive a second copy of the first intermediate signal VREG.

An output terminal of the inverter INV3 may be electrically connected to each of an input terminal of the inverter INV1 and an input terminal of the output unit 43 of the voltage-controlled oscillator 14. The output terminal of the inverter INV3 may output the second intermediate signal VREG2. A positive voltage supply terminal of the inverter INV3 may be electrically connected to the output terminal of the voltage-controlled frequency unit 41 (e.g., the drain terminal of the p-channel transistor P4) and may receive a third copy of the first intermediate signal VREG.

There may be an even number of additional inverters electrically connected between the inverter INV2 and the inverter INV3.

The output unit 43 of the voltage-controlled oscillator 14 may include an inverter INV4. The inverter INV4 may be a CMOS inverter. An input terminal of the inverter INV4 may be electrically connected to an output terminal of the oscillation unit 42 (e.g., the output terminal of the inverter INV3) and may receive the second intermediate signal VREG2. An output terminal of the inverter INV4 may output the output signal OSC_OUT. The output unit 43 may enhance load capability of the voltage-controlled oscillator 14.

According to embodiments, a control voltage Vctrl provided by the loop filter 13 may function as a bias voltage for PMOS current sources of analog circuits of both the charge pump 12 and the voltage-controlled oscillator 14. Therefore, the phase-locked loop device 10 may not need a band gap reference circuit that is typically required in a conventional phase-locked loop. Advantageously, the phase-locked loop device 10 may be substantially smaller than conventional phase-locked loops.

According to embodiments, a same control voltage Vctrl may drive both the voltage-controlled oscillator 14 and the charge pump 12, the frequency fvco of the output signal OSC_OUT provided by the voltage-controlled oscillator 14 may be directly proportional to the control voltage Vctrl, the charging or discharging current Icp provided by the charge pump 12 may be linearly related to the control voltage Vctrl. Accordingly, the open loop gain, closed loop damping factor, and/or attenuation frequency associated with the phase-locked loop device 10 may be substantially stable under various values of the control voltage Vctrl and/or under various values of the frequency fvco of the output signal OSC_OUT. Advantageously, the phase-locked loop device 10 may operate with satisfactory stability.

Figure 5:
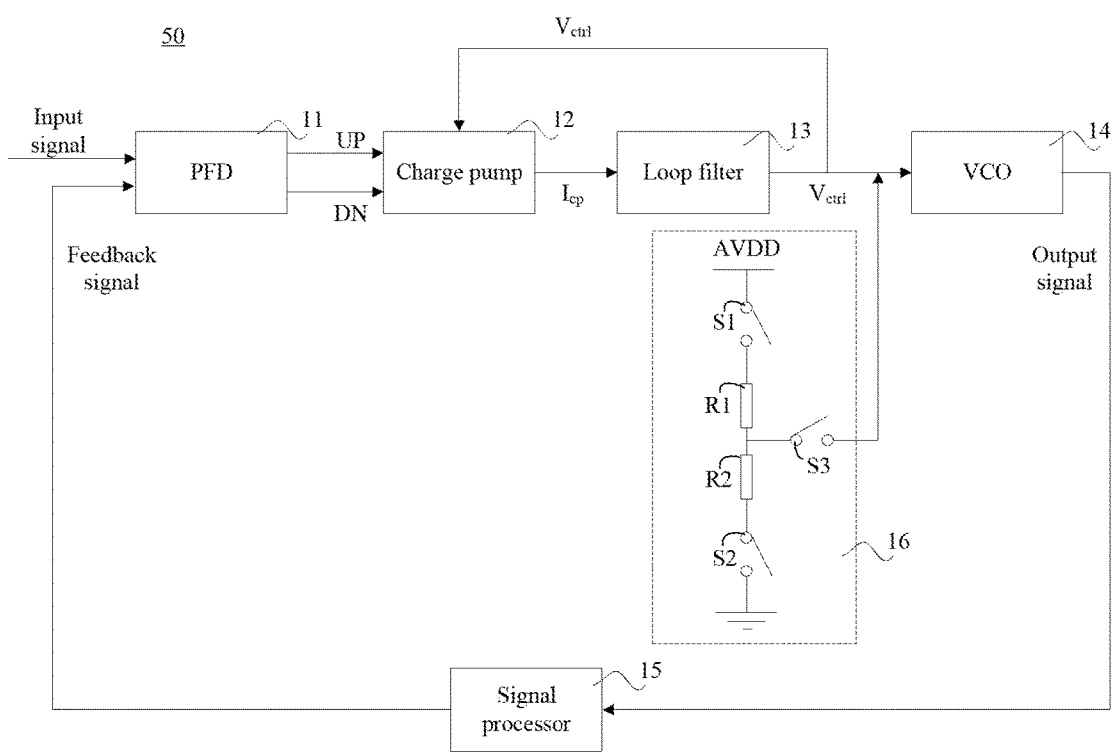
FIG. 5 shows a schematic diagram (e.g., a schematic circuit block diagram) that illustrates elements and/or structures in a phase-locked loop device in accordance with one or more embodiments.

FIG. 5 shows a schematic diagram (e.g., a schematic circuit block diagram) that illustrates elements and/or structures in a phase-locked loop device 50 in accordance with one or more embodiments. Some features and advantages of the phase-locked loop device 50 may be identical to and/or analogous to some features and advantages of the above-described phase-locked loop device 10.

The phase-locked loop device 50 may further include a voltage unit 16 (or startup voltage unit 16). The voltage unit 16 may include a switch S1, a resistor R1, a resistor R2, a switch S2, and a switch S3. A first terminal of the switch S1 may receive a second copy of the positive supply voltage AVDD. A first terminal of the resistor R1 may be electrically connected to a second terminal of the switch S1. A first terminal of the resistor R2 may be electrically connected to a second terminal of the resistor R1. A first terminal of the switch S2 may be electrically connected to a second terminal of the resistor R2. A second terminal of the switch S2 may receive a ground voltage GND. A first terminal of the switch S3 may be electrically connected to each of the second terminal of the resistor R1 and the first terminal of the resistor R2. A second terminal of the switch S3 may be electrically connected to each of an input terminal of the voltage-controlled frequency unit 41 (i.e., an input terminal of the voltage-controlled oscillator 14) and an input terminal of the charge pump 12 and may output a startup voltage. The second terminal of the switch S3 may be electrically connected to each of the gate terminal of the p-channel transistor P3, the non-inverting input terminal of the amplifier Amp1, and the input terminal of the charge pump 12.

The startup voltage by function as an initial control voltage Vctrl to start looping of the phase-locked loop device 50. The start voltage may be sufficiently low for enabling a sufficiently large biasing current in the charge pump 12 and/or the voltage-controlled oscillator 14. In an embodiment, an electrical resistance of the resistor R1 may be equal to an electrical resistance of the resistor R2, such that the startup voltage (i.e., the initial control voltage Vctrl) may be equal to AVDD/2 to ensure a sufficiently large initial biasing current. The positive supply voltage AVDD may be equal to the positive supply voltage VDD.

A reset signal may be used to generate a pulse signal for resetting the phase-locked loop device 50. A high voltage level time duration is at least tens of nanoseconds. Once the phase-locked loop device 50 is reset, the high voltage of the pulse signal may cause the switches S1, S2, and S3 to close and may charge capacitors C1 and C2 (illustrated in FIG. 3) to the startup voltage (i.e., the initial control voltage Vctrl). The input terminal of the charge pump 12 may receive a first copy of the startup voltage. The input terminal of the input terminal of the voltage-controlled frequency unit 41 (i.e., the input terminal of the voltage-controlled oscillator 14) may receive a second copy of the startup voltage. The gate terminal of the p-channel transistor P1 of the charge pump 12 may receive a first duplicate of the first copy of the startup voltage. The gate terminal of the p-channel transistor P2 of the charge pump 12 may receive a second duplicate of the first copy of the startup voltage. Accordingly, looping of the phase-locked loop device 50 may be initiated.

Subsequently, the pulse signal may be at the low voltage, which may cause the switches S1, S2, and S3 to open, such that the voltage unit 16 may be electrically disconnected from each of the charge pump 12 and the voltage-controlled oscillator 14. The locked loop device 50 may continue with normal operation.

As can be appreciated from the description, phase-locked loop device according to one or more embodiments may have a substantially small size, may operate with satisfactory stability, and/or may operate with substantially low power consumption. Advantageously, the phase-locked loop device may be suitable for various applications.

While some embodiments have been described as examples, there are alterations, permutations, and equivalents. It should also be noted that there are many alternative ways of implementing the methods and apparatuses. Furthermore, embodiments may find utility in other applications. The abstract section, limited by word count limitation, is provided for reading convenience and should not be employed to limit the scope of the claims. It is therefore intended that the following appended claims be interpreted as including all alterations, permutations, and equivalents.

What is claimed is:

1. A phase-locked loop device comprising:
a phase frequency detector configured to receive an input signal and a first feedback signal and configured to generate a control signal set based on the input signal and the first feedback signal;
a charge pump electrically connected to the phase frequency detector, wherein the charge pump comprises:
a first p-channel transistor, which is electrically connected to an output terminal of the loop filter, is configured to receive a first duplicate of the first copy of the control voltage, and is configured to receive a first copy of a first positive supply voltage;
a second p-channel transistor, which is electrically connected to the output terminal of the loop filter, is configured to receive a second duplicate of the first copy of the control voltage, and is configured to receive a second copy of the first positive supply voltage;
a first n-channel transistor, which is electrically connected to the first p-channel transistor and is configured to receive a first copy of a ground voltage;
a second n-channel transistor, which is electrically connected to the second p-channel transistor;
a third n-channel transistor, which is electrically connected to each of the second n-channel transistor and the second p-channel transistor and is configured to receive a second copy of the ground voltage;
a current mirror, which is electrically connected to an input terminal of the loop filter, is configured to provide the second current to the loop filter, is configured to receive a third copy of the first positive supply voltage, and is configured to receive a third copy of the ground voltage;
a p-channel mirror biasing circuit set, which is electrically connected to the current mirror; and
an n-channel mirror biasing circuit set, which is electrically connected to each of the current mirror and the second n-channel transistor;
a loop filter electrically connected to the charge pump, configured to receive a first current from the charge pump, and configured to generate a control voltage based on the first current, wherein the charge pump is configured to generate a second current based on the control signal set and a first copy of the control voltage and is configured to provide the second current to the loop filter, and wherein the second current is linearly related to the control voltage;

a voltage-controlled oscillator electrically connected to the loop filter and configured to generate an output signal based on a second copy of the control voltage, wherein a frequency of the output signal is directly proportional to the control voltage; and
a signal processor electrically connected to each of the voltage-controlled oscillator and the phase frequency detector, configured to generate a second feedback signal based on the output signal, and configured to provide the second feedback signal to the phase frequency detector.

2. The phase-locked loop device of claim 1,
wherein a gate terminal of the first p-channel transistor is configured to receive the first duplicate of the first copy of the control voltage,
wherein a source terminal of the first p-channel transistor is configured to receive the first copy of the first positive supply voltage,
wherein a drain terminal of the first p-channel transistor is electrically connected, through no intervening transistor, to each of a drain terminal of the first n-channel transistor and a gate terminal of the first n-channel transistor,
wherein a gate terminal of the second p-channel transistor is configured to receive the second duplicate of the first copy of the control voltage,
wherein a source terminal of the second p-channel transistor is configured to receive the second copy of the first positive supply voltage, and
wherein a drain terminal of the second p-channel transistor is electrically connected, not through any intervening transistor, to each of a drain terminal of the second n-channel transistor and a gate terminal of the third n-channel transistor.

3. The phase-locked loop device of claim 2,
wherein a gate terminal of the second n-channel transistor is electrically connected, not through any intervening transistor, to the n-channel mirror biasing circuit set.

4. The phase-locked loop device of claim 2,
wherein the first p-channel transistor operates in a first linear region, and
wherein the second p-channel transistor operates in a second linear region.

5. The phase-locked loop device of claim 1, wherein the current mirror comprises:
a third p-channel transistor, which is configured to receive the third copy of the first positive supply voltage and is electrically connected to a first output terminal of the p-channel mirror biasing circuit set;
a fourth p-channel transistor, which is electrically connected to the third p-channel transistor and is electrically connected to a second output terminal of the p-channel mirror biasing circuit set;
a fifth p-channel transistor, which is electrically connected to the fourth p-channel transistor;
a sixth p-channel transistor, which is electrically connected to each of the fourth p-channel transistor and the fifth p-channel transistor;
a fourth n-channel transistor, which is configured to receive the third copy of the ground voltage and is electrically connected to a first output terminal of the n-channel mirror biasing circuit set;
a fifth n-channel transistor, which is electrically connected to the fourth n-channel transistor and is electrically connected to a second output terminal of the n-channel mirror biasing circuit set;

a sixth n-channel transistor, which is electrically connected to the fifth n-channel transistor;
a seventh n-channel transistor, which is electrically connected to each of the fifth n-channel transistor and the sixth n-channel transistor;
an amplifier, which is electrically connected to each of the fifth p-channel transistor, the sixth p-channel transistor, the sixth n-channel transistor, and the seventh n-channel transistor; and
an output terminal of the current mirror, which is electrically connected to each of the sixth p-channel transistor, the seventh n-channel transistor, the amplifier, and the input terminal of the loop filter and is configured to output the second current.

6. The phase-locked loop device of claim 5,
wherein a source terminal of the third p-channel transistor is configured to receive the third copy of the first positive supply voltage; wherein a gate terminal of the third p-channel transistor is electrically connected to the first output terminal of the p-channel mirror biasing circuit set; wherein a drain terminal of the third p-channel transistor is electrically connected to a source terminal of the fourth p-channel transistor;
wherein a gate terminal of the fourth p-channel transistor is electrically connected to the second output terminal of the p-channel mirror biasing circuit set; wherein a drain terminal of the fourth p-channel transistor is electrically connected each of a source terminal of the fifth p-channel transistor and a source terminal of the sixth p-channel transistor;
wherein a gate terminal of the fifth p-channel transistor is configured to receive a first differential component of the control signal set; wherein a drain terminal of the fifth p-channel transistor is electrically connected to each of a drain terminal of the sixth n-channel transistor, an output terminal of the amplifier, and an inverting input terminal of the amplifier;
wherein a gate terminal of the sixth p-channel transistor is configured to receive a second differential component of the control signal set; wherein a drain terminal of the sixth p-channel transistor is electrically connected to each of a drain terminal of the seventh n-channel transistor, a non-inverting input terminal of the amplifier, and the output terminal of the current mirror;
wherein a source terminal of the fourth n-channel transistor is configured to receive the third copy of the ground voltage; wherein a gate terminal of the fourth n-channel transistor is electrically connected to the first output terminal of the n-channel mirror biasing circuit set; wherein a drain terminal of the fourth n-channel transistor is electrically connected to a source terminal of the fifth n-channel transistor;
wherein a gate terminal of the fifth n-channel transistor is electrically connected to the second output terminal of the n-channel mirror biasing circuit set; wherein a drain terminal of the fifth n-channel transistor is electrically connected to each of a source terminal of the sixth n-channel transistor and a source terminal of the seventh n-channel transistor;
wherein a gate terminal of the sixth n-channel transistor is configured to receive a third differential component of the control signal set; wherein a drain terminal of the sixth n-channel transistor is electrically connected to each of the drain terminal of the fifth p-channel transistor, the output terminal of the amplifier, and the inverting input terminal of the amplifier;
wherein a gate terminal of the seventh n-channel transistor is configured to receive a fourth differential component of the control signal set; and wherein a drain terminal of the seventh n-channel transistor is electrically connected to each of a drain terminal of the sixth p-channel transistor, the non-inverting input terminal of the amplifier, and the output terminal of the current mirror.

7. The phase-locked loop device of claim 1, wherein the voltage-controlled oscillator comprises:
a voltage-controlled frequency unit, which is configured to receive a first copy of a positive supply voltage, is electrically connected to the loop filter, and is configured to generate a first intermediate signal based on the second copy of the control voltage, wherein a frequency of the first intermediate signal is directly proportional to the control voltage;
an oscillation unit, which is electrically connected to the voltage-controlled frequency unit and is configured to generate a second intermediate signal based on the first intermediate signal; and
an output unit, which is electrically connected to the oscillation unit and is configured to generate the output signal based on the second intermediate signal.

8. The phase-locked loop device of claim 7, wherein the voltage-controlled frequency unit comprises:
a first p-channel transistor, which is electrically connected to the loop filter, is configured to receive a first duplicate of the second copy of the control voltage, and is configured to receive the first copy of the positive supply voltage;
a second p-channel transistor, which is electrically connected to each of the first p-channel transistor and an input terminal of the oscillation unit; and
an amplifier, which is electrically connected to each of the loop filter, the first p-channel transistor, and the second p-channel transistor and is configured to receive a second duplicate of the second copy of the control voltage.

9. The phase-locked loop device of claim 8,
wherein a gate terminal of the first p-channel transistor is configured to receive the first duplicate of the second copy of the control voltage; wherein a source terminal of the first p-channel transistor is configured to receive the positive supply voltage; wherein a drain terminal of the first p-channel transistor is electrically connected to a source terminal of the second p-channel transistor;
wherein a gate terminal of the second p-channel transistor is electrically connected to each of an output terminal of the amplifier and an inverting input terminal of the amplifier; wherein a drain terminal of the second p-channel transistor is electrically connected to the input terminal of the oscillation unit; and
wherein a non-inverting input terminal of the amplifier is electrically connected to each of the loop filter and the first p-channel transistor and is configured to receive the second duplicate of the second copy of the control voltage.

10. The phase-locked loop device of claim 9,
wherein the first p-channel transistor operates in a linear region, and
wherein the second p-channel transistor operates in a saturation region.

11. The phase-locked loop device of claim 9 further comprising a voltage unit, which comprises:

a first switch, wherein a first terminal of the first switch is configured to receive a second copy of the positive supply voltage;

a first resistor, wherein a first terminal of the first resistor is electrically connected to a second terminal of the first switch;

a second resistor, wherein a first terminal of the second resistor is electrically connected to a second terminal of the first resistor;

a second switch, wherein a first terminal of the second switch is electrically connected to a second terminal of the second resistor, wherein a second terminal of the second switch is configured to receive a ground voltage; and a third switch, wherein a first terminal of the third switch is electrically connected to each of the second terminal of the first resistor and the first terminal of the second resistor, and wherein a second terminal of the third switch is electrically connected to each of the gate terminal of the first p-channel transistor, the non-inverting input terminal of the amplifier, and an input terminal of the charge pump and is configured to output a startup voltage.

12. The phase-locked loop device of claim 11, wherein an electrical resistance of the first resistor is equal to an electrical resistance of the second resistor.

13. The phase-locked loop device of claim 7, wherein the oscillation unit comprises:
a first inverter, wherein a positive voltage supply terminal of the first inverter is electrically connected to the voltage-controlled frequency unit and is configured to receive a first copy of the first intermediate signal;
a second inverter, wherein an input terminal of the second inverter is electrically connected to an output terminal of the first inverter, and wherein a positive voltage supply terminal of the second inverter is electrically connected to the voltage-controlled frequency unit and is configured to receive a second copy of the first intermediate signal; and
a third inverter, wherein an output terminal of the third inverter is electrically connected to each of an input terminal of the first inverter and an input terminal of the output unit of the voltage-controlled oscillator, wherein a positive voltage supply terminal of the third inverter is electrically connected to the voltage-controlled frequency unit and is configured to receive a third copy of the first intermediate signal, and wherein a total number of inverters in the oscillation unit is an odd number.

14. The phase-locked loop device of claim 7, wherein the output unit comprises:
an inverter, wherein an input terminal of the inverter is electrically connected to an output terminal of the oscillation unit and is configured to receive the second intermediate signal, and wherein an output terminal of the inverter is configured to output the output signal.

15. The phase-locked loop device of claim 7 further comprising a voltage unit, which comprises:
a first switch, wherein a first terminal of the first switch is configured to receive a second copy of the positive supply voltage;
a first resistor, wherein a first terminal of the first resistor is electrically connected to a second terminal of the first switch;
a second resistor, wherein a first terminal of the second resistor is electrically connected to a second terminal of the first resistor;
a second switch, wherein a first terminal of the second switch is electrically connected to a second terminal of the second resistor, wherein a second terminal of the second switch is configured to receive a ground voltage; and
a third switch, wherein a first terminal of the third switch is electrically connected to each of the second terminal of the first resistor and the first terminal of the second resistor, and wherein a second terminal of the third switch is electrically connected to each of an input terminal of the voltage-controlled frequency unit and an input terminal of the charge pump and is configured to output a startup voltage.

16. The phase-locked loop device of claim 15, wherein all of the first switch, the second switch, and the third switch are configured to close simultaneously.

17. The phase-locked loop device of claim 1 further comprising a voltage unit, which comprises:
a first switch, wherein a first terminal of the first switch is configured to receive a second copy of the positive supply voltage;
a first resistor, wherein a first terminal of the first resistor is electrically connected to a second terminal of the first switch;
a second resistor, wherein a first terminal of the second resistor is electrically connected to a second terminal of the first resistor;
a second switch, wherein a first terminal of the second switch is electrically connected to a second terminal of the second resistor, wherein a second terminal of the second switch is configured to receive a ground voltage; and
a third switch, wherein a first terminal of the third switch is electrically connected to each of the second terminal of the first resistor and the first terminal of the second resistor, wherein a second terminal of the third switch is electrically connected to each of an input terminal of the voltage-controlled oscillator and an input terminal of the charge pump and is configured to output a startup voltage.

18. The phase-locked loop device of claim 17, wherein the input terminal of the charge pump is configured to receive a first copy of the startup voltage, and wherein the input terminal of the voltage-controlled oscillator is configured to receive a second copy of the startup voltage.

19. The phase-lock loop device of claim 17, wherein the charge pump comprises a first p-channel transistor and a second p-channel transistor, wherein a gate terminal of the first p-channel transistor is electrically connected to the second terminal of the third switch and is configured to receive a first duplicate of a copy of the startup voltage, and wherein gate terminal of the second p-channel transistor is electrically connected to the second terminal of the third switch and is configured to receive a second duplicate of the copy of the startup voltage.

* * * * *